United States Patent [19]
Makino

[11] Patent Number: 5,166,895
[45] Date of Patent: Nov. 24, 1992

[54] INPUT-WEIGHTED TRANSVERSAL FILTER

[75] Inventor: Takashi Makino, Tokyo, Japan

[73] Assignee: Kabushiki Kaisha Toshiba, Kawasaki, Japan

[21] Appl. No.: 723,416

[22] Filed: Jun. 28, 1991

[30] Foreign Application Priority Data

Jun. 28, 1990 [JP] Japan ................... 2-171201

[51] Int. Cl.⁵ .................. G06F 15/31; G06F 7/52
[52] U.S. Cl. ........................ 364/724.16; 364/758
[58] Field of Search ............... 364/724.16, 724.13, 364/757, 754, 736, 758

[56] References Cited

U.S. PATENT DOCUMENTS 4,594,678 6/1986 Uhlenhoff .................. 364/736

FOREIGN PATENT DOCUMENTS 1268306 10/1989 Japan .

OTHER PUBLICATIONS

IEEE International Solid–State Circuits Conference, Digest of Technical Papers, pp. 92–93, 1984.

Primary Examiner—Tan V. Mai
Attorney, Agent, or Firm—Oblon, Spivak, McClelland, Maier & Neustadt

[57] ABSTRACT

Tap arithmetic units and first delay circuits are arranged alternately. Each of the tap arithmetic units has a full-adder array for multiplying an input signal which has been sampled at regular intervals and coefficients, a second pipeline delay circuit for delaying outputs of the full-adder array by a predetermined time and an adder circuit for adding outputs of the second delay circuits. The first and second delay circuits are timed to the preceding tap arithmetic unit for arithmetic operations. The use of the second delay circuit for the timing of arithmetic operations permits the arrangement of the first delay circuit to be simplified.

8 Claims, 14 Drawing Sheets

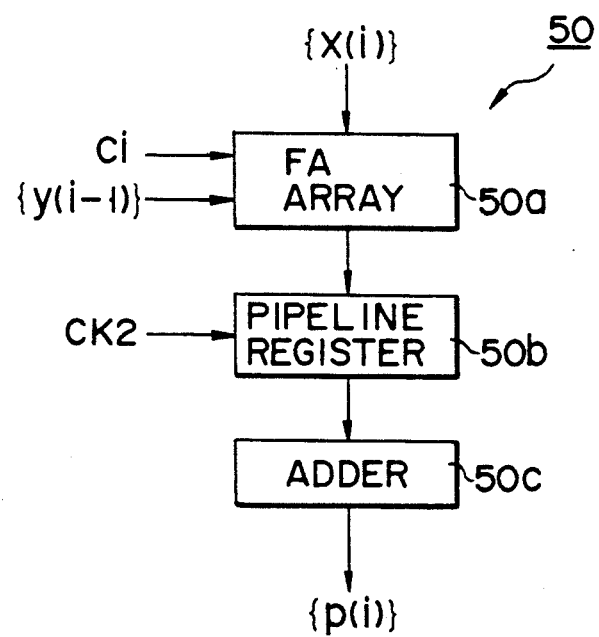
F I G. 1

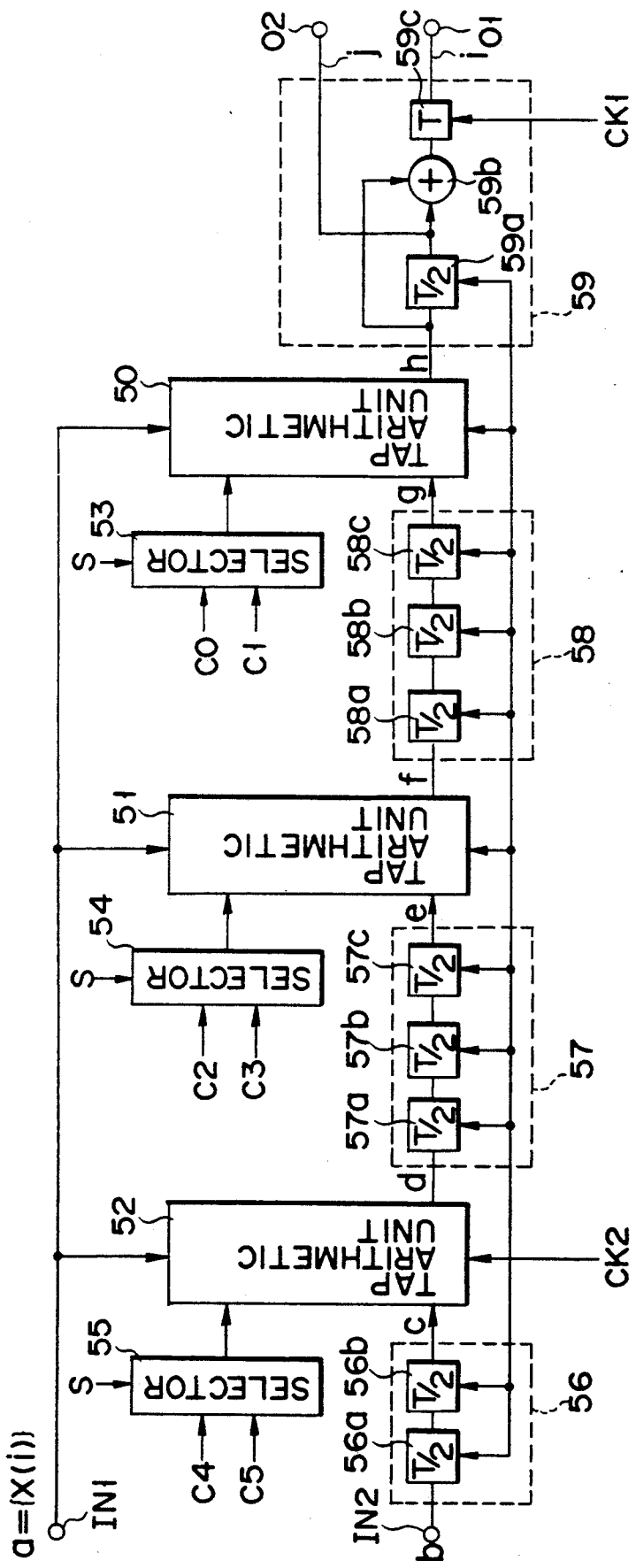
F I G. 3

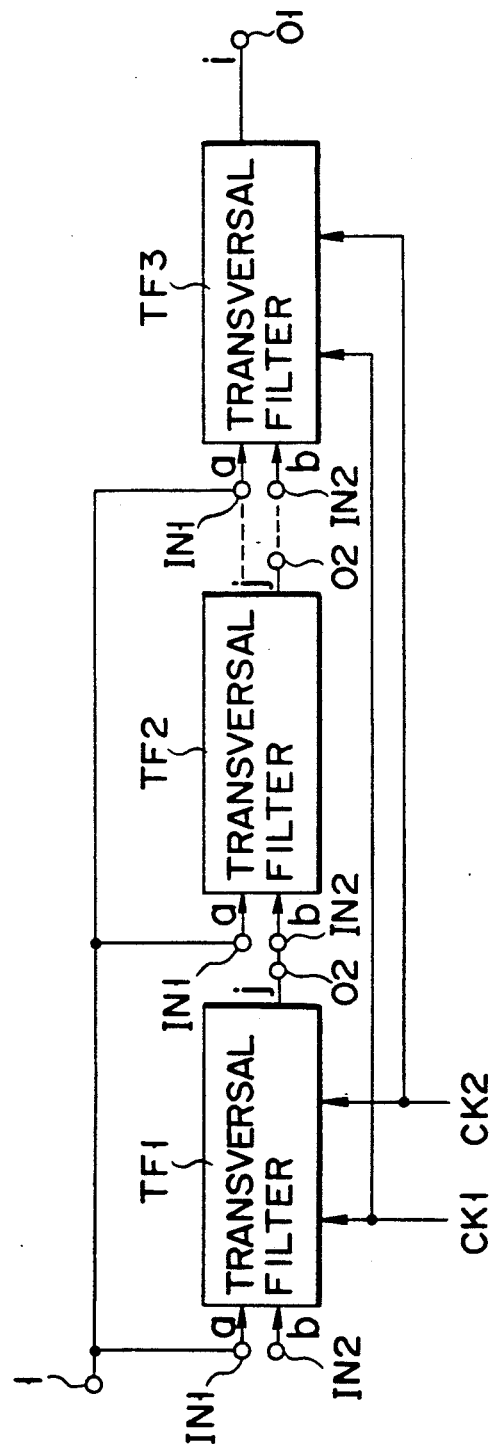
F I G. 4

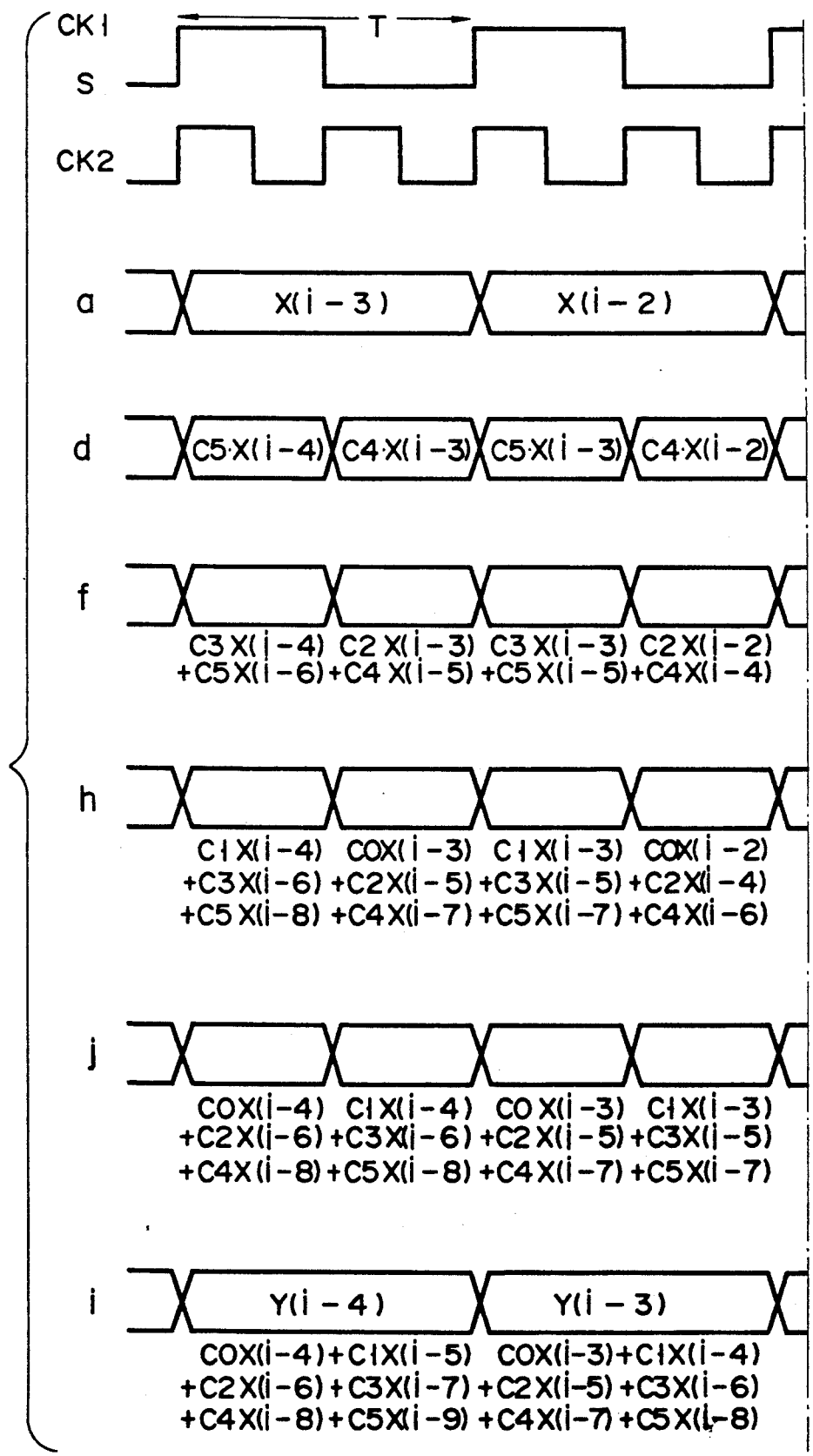
F I G. 5A

INPUT-WEIGHTED TRANSVERSAL FILTER

BACKGROUND OF THE INVENTION

1. Field of the Invention

The present invention relates to a filter adapted to, for example, remove ghost signals or multipath signals from a video signal, and more particularly, to an input-weighted transversal filter for performing filtering arithmetic processing on digital signal, such as a video signal, an audio signal, etc., in real time.

2. Description of the Related Art

FIG. 6 illustrates a conventional 6-tap input-weighted transversal filter. To an input terminal 1 of the transversal filter is applied a time-series input signal $\{X(i)\}$ which has been sampled at regular intervals T. The input signal $\{X(i)\}$ is applied to six coefficient multipliers 10 to 15. Each of the multipliers 10 to 15 is constructed mainly from a multiplier. The multipliers 10 to 14 multiply the input signal $\{X(i)\}$ by coefficients C0 to C4, respectively, and feed the results of the multiplication to adders 20 to 24, respectively. The multiplier 15 multiples the input signal by the coefficient C5 and then applies the output to a delay element 34 for introducing a time delay T in a signal.

The delay elements 30 to 34 are connected in cascade with each of the adders 21 to 24 interposed between adjoining delay elements. An input of the adder 20 is connected to the delay element 30. An output signal of the adder 20 is coupled to an output terminal 2 via a delay element 4. The delay elements 30 to 34 are driven by a clock signal CK.

The output signal $\{Y(i)\}$ of the adder 20 of the transversal filter is represented by $$Y(i) = \sum_{j=0}^{5} C(j)X(i-j) \quad (1)$$

The signal $\{Y(i)\}$ is held for a time interval T by the delay element 4 to provide the final output signal of the transversal filter.

FIG. 7 is a block diagram illustrating an actual hardware configuration of the transversal filter. This transversal filter is composed of six tap arithmetic units 41.

FIG. 8 illustrates an arrangement of the tap arithmetic unit 41 of FIG. 7. In this FIGURE, a delay element 44 comprised of, for example, a shift register is interposed between a pipeline type multiplier 42 and an adder 43 which serve as the arithmetic unit. The delay element 44 is provided in view of the arithmetic operation speed of the pipeline multiplier 42. In the tap arithmetic unit 41, the input signal $\{(X(i)\}$ and the coefficient Ci is multiplied and the result of the multiplication is delayed by the delay element 44 in synchronization with the clock signal CK1. The adder 43 adds an output signal $\{Y(i-1)\}$ output from the preceding tap arithmetic unit not shown to the signal output from the delay element 44. The result of the addition is delayed by a given time by the delay element 45 to yield the signal $\{Y(i)\}$.

FIGS. 9A, 9B and 9C are a timing chart of the operation of the transversal filter of FIG. 7. The output signals of the tap arithmetic units are also indicated.

FIG. 10 illustrates an example of the pipeline multiplier 42 of FIG. 8. In this pipeline multiplier 42, the input signal $\{X(i)\}$ is 5 bits in length and the coefficient Ci is 5 bits in length.

In FIG. 10, the pipeline multiplier 42 is constructed from a multiplier 42a, a pipeline delay circuit 42b and an adder 42c. The multiplier 42a is constructed from half-adders (HA) and full-adders (FA) to multiply the input signal $\{X(i)\}$ and the coefficients. The delay circuit 42b is constructed from shift registers R20 to R32 to delay output signals of the multiplier 42a in response to the clock signal CK. The adder 42c comprises a half-adder H15 and full-adders F37 to F39.

The tap arithmetic unit 41 constructed as above includes the delay circuit 42b within the pipeline multiplier 42 and the delay element 44 for delaying the output signal of the multiplier 42. Thus, in the integrated-circuit version of the tap arithmetic unit, the delay elements will occupy a large area of the integrated-circuit chip because there is a need for many shift registers, increasing manufacturing cost.

Moreover, in the cascade-connection of transversal filters, the delay amount of the entire system will increase because the number of shift registers is large. To circumvent this, unnecessary full-adders are required in the succeeding transversal filters.

SUMMARY OF THE INVENTION

It is the object of the present invention to provide an input-weighted transversal filter which permits an integrated-circuit chip area and a delay amount of the entire system to be reduced.

According to the present invention there is provided an input-weighted transversal filter for sequentially weighting an input signal by means of a plurality of tap arithmetic units comprising:

a plurality of tap arithmetic units for multiplying an input signal which has been sampled at regular intervals and coefficients, each of said tap arithmetic units adding an output signal of the preceding tap arithmetic unit to the result of the multiplication; and first delay circuits each interposed between adjacent ones of said tap arithmetic units, each of said tap arithmetic units comprising a full-adder array for multiplying said input signal and said coefficients and adding the output signal of the preceding tap arithmetic unit to the result of the multiplication, a second pipeline delay circuit for delaying an output signal of said full-adder array by a predetermined time, and an adder for producing the output signal, said first and second delay circuits being timed to the preceding tap arithmetic unit for arithmetic operations.

According to the present invention, in each of the tap arithmetic units, an input signal which has been sampled at regular intervals is multiplied by coefficients, a data input signal from the preceding tap arithmetic unit is added to the results of the multiplication and the results of the addition are delayed by registers serving as a pipeline delay circuit. Therefore, the number of delay elements in each of the tap arithmetic units can be reduced. In the case of integrated-circuit version, this permits the chip area and the system delay amount to be reduced.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a block diagram of a tap arithmetic unit according to an embodiment of the present invention;

FIG. 3 illustrates an arrangement of an input-weighted transversal filter;

FIG. 4 illustrates a cascade of the transversal filters of FIG. 3;

FIGS. 5A, 5B and 5C are a diagram for use in explanation of the operation of the arrangement of FIG. 4;

DETAILED DESCRIPTION OF THE PREFERRED EMBODIMENTS

Figure 2:
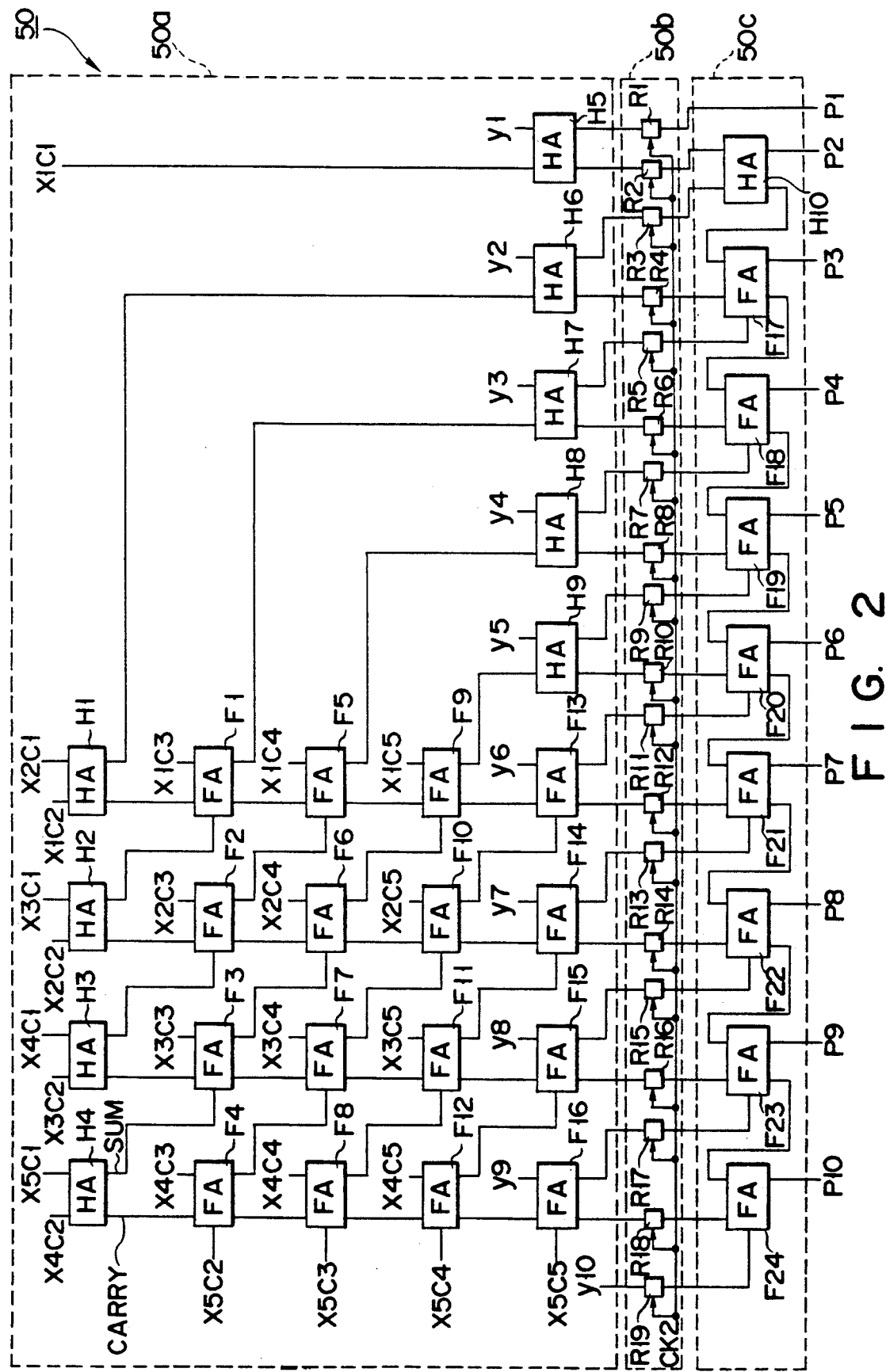
FIG. 2 is a detailed block diagram of the tap arithmetic unit of FIG. 1.

An embodiment of the present invention will be described with reference to the drawings hereinafter.

FIG. 3 illustrates a transversal filter in which the number of taps is six and the number of time-division multiplexed coefficients is two. An input terminal IN1 of the filter is connected to receive a time-series input signal a={X(i)} which has been sampled at regular intervals T. The input signa a is applied to tap arithmetic units 50, 51 and 52. Selectors 53, 54 and 55 are connected to the tap arithmetic units 50, 51 and 52, respectively. The selector 53 is responsive to a select signal S to select either of coefficients C0 and Cl for application to the tap arithmetic unit 50. The selector 54 is responsive to the select signal S to select either of coefficients C2 and C3 for application to the tap arithmetic unit 51. The selector 55 is responsive to the select signal S to select either of coefficients C4 and C45 for application to the tap arithmetic unit 52. That is, the selector 53 selects, for example, Co during the first half interval T/2 of the interval T and Cl during the second half interval T/2 of the interval T. The selector 54 selects, for example, C2 during the first-half interval T/2 of the interval T and C3 during the second-half interval T/2. The selector 55 selects, for example, C4 during the first half interval T/2 of the interval T and C5 during the second half interval T/2.

To the tap arithmetic unit 52 is applied a signal b output from the preceding transversal filter stage not shown via a cascade data circuit input circuit 56 as an input signal c. The cascade data input circuit 56 is constructed from delay elements 56a and 56b each introducing a time delay of T/2. The tap arithmetic unit 52 multiplies the input signal a and the coefficient C4 or C5 and adds the input signal c to the result of the multiplication. The result of the addition is delayed by T/2 by a delay element (not shown) in the tap arithmetic unit 52 to provide a signal d. The signal d is applied to the tap arithmetic unit 51 via a delay circuit 57 as an input signal e. The delay circuit 57 comprises delay elements 57a, 57b and 57c each introducing a time delay of T/2.

The tap arithmetic unit 51 multiplies the input signal a and the coefficient C2 and C3, adds the input signal e to the result of the addition and delays the result of the addition by T/2 by a delay element (not shown) in the tap arithmetic unit 51 to yield a signal f. The signal F is applied to the tap arithmetic unit 50 via a delay circuit 58 as an input signal g. The delay circuit 58 comprises delay elements 58a, 58b and 58c each introducing a time delay of T/2.

The tap arithmetic unit 50 multiplies the input signal a and the coefficient C0 or C1, adds the input signal g to the result of the addition and delays the result of the addition by T/2 by a delay element (not shown) in the tap arithmetic unit 51 to produce a signal h. The signal h is applied to the succeeding transversal filter stage not shown via a cascade data output circuit 59, which comprises a delay element 59a for introducing a time delay of T/2 to the signal h, an adder 59b for adding the signals h before and after the delay in the delay element 59a and a delay element 59c for delaying an output signal of the adder 59b by T. The output of the delay element 59c is connected to an output terminal 01, and the output of the delay element 59a is connected to an output terminal 02.

The tap arithmetic units 50 to 52 and the delay elements 56a to 59a are driven by a clock signal CK2 and the delay element 59c is driven by the clock signal CK1. The period of the clock signal CK1 is T, while the period of the clock signal CK2 is T/2.

FIG. 4 illustrates a cascade connection of transversal filter stages TF1 to TFn each constructed as above. Each of the preceding transversal filter stages, like the filter stages TF1, TF2, has its output terminal 02 connected to the input terminal IN2 of the succeeding filter stage. In the case of the last stage, like the filter stage TFn, its output terminal 01 is employed.

FIG. 1 is a block diagram of each of the tap arithmetic units 50 to 52. The tap arithmetic units 50 to 52 are equal to one another in construction and hence the construction of the tap arithmetic unit 50 will be described hereinafter.

The tap arithmetic unit 50 comprises a full-adder (FA) array 50a, a pipeline register 50b and an adder 50c. The full-adder array 50a multiplies an input signal {X(i)} and a coefficient Ci and adds an input signal {y(i-1)} to the result of the multiplication. The result of the addition i transferred to the pipeline register 50b in synchronism with the clock signal CK2. An output signal of the register 50b is added in the adder 50c. The result of the addition is output as a data input signal {P(i)}.

FIG. 2 illustrates a specific arrangement of the tap arithmetic unit 50. In this example, the full-adder array 50a is of a carry save adder (CSA) type, in which the input signal x(i) has five bits of x5 to xl, the coefficient Ci has five bits of c5 to cl and the input signal y(i-1) has 10 bits of y10 to yl. The adder 50c is of a ripple carry type, in which P(i) has 10 bits of P10 to P1.

In the full-adder array 50a, the input signal {X(i)} and the coefficient Ci are multiplied by the half-adders H1 to H4 and the full-adders F1 to F16, and the sums of the half-adder H1 and the full-adders F1, F5 and F9 and the input signal {y(i-1)} are added by the half-adders H5 to H9. The carries and sums of the half-adders H5 to H9 and the full adders F13 to F16 and the input signal yl0 are transferred to registers R1 to R19 constituting the pipeline register 50b in synchronism with the clock signal CK2. Outputs of the registers R2 to R19 are added by a half-adders H10 and full-adders F17 to F24 constituting the adder 50c. The outputs of the register R1 and the full-adders F17 to F24 are out-put as the input signal {P(i)}.

As the full-adder array system 50a, use may be made of a modified CSA array system (IEEE International Solid-State Circuits Conference, DIGEST OF TECHNICAL PAPERS p. 92-93). In addition, as the adder 50c, a carry look ahead system may be used.

Figure 5B:
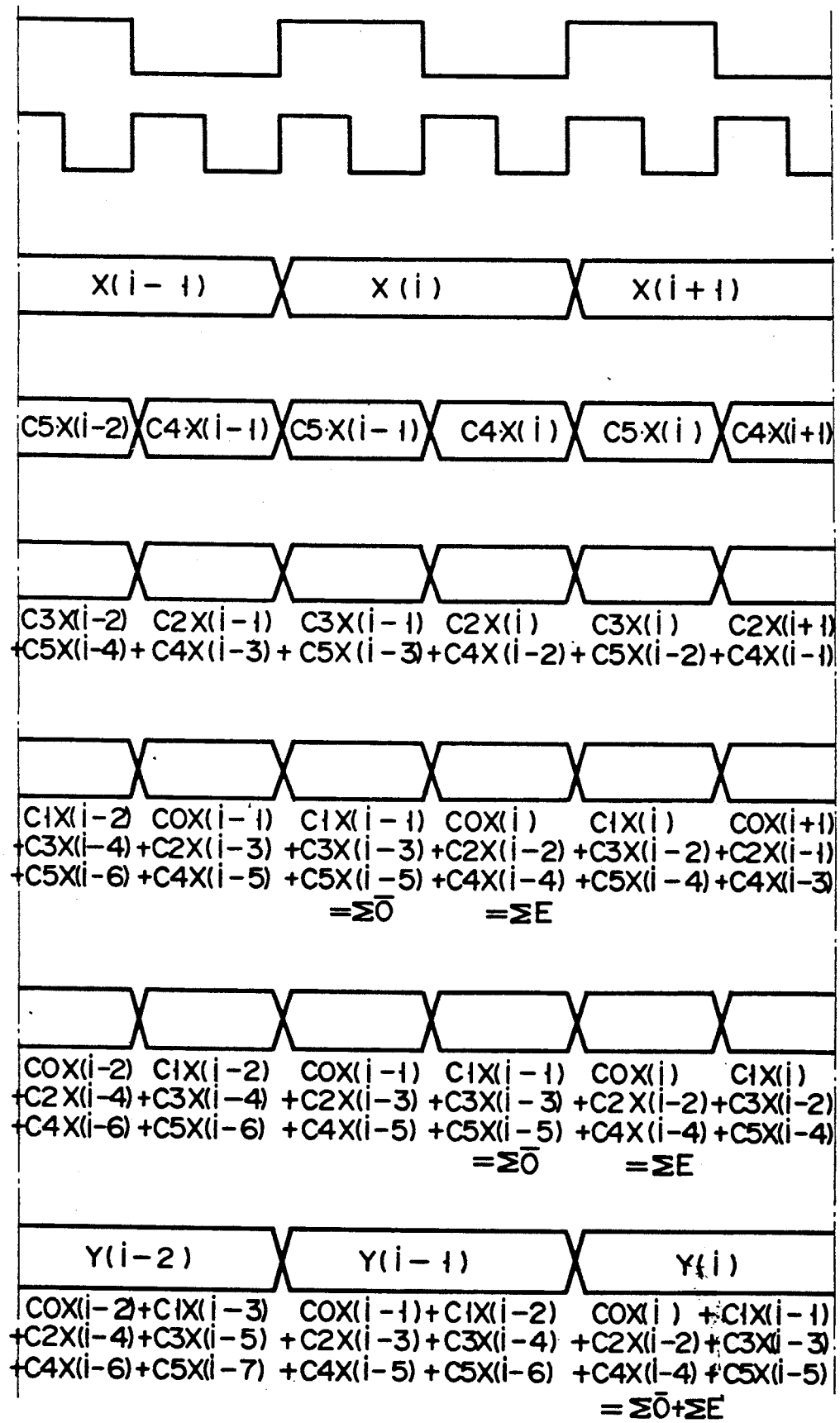
Figure 5C:
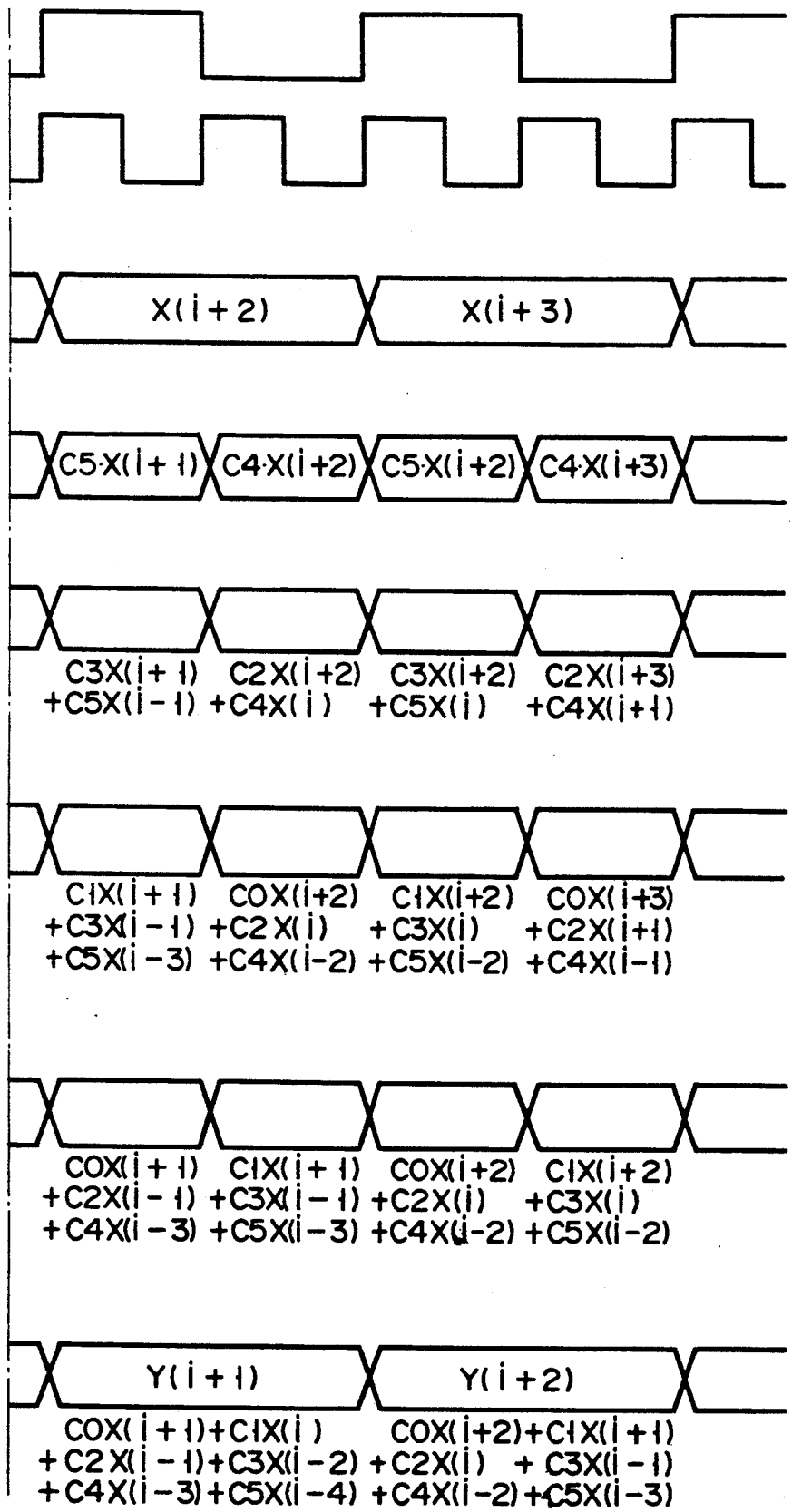
Figure 6:
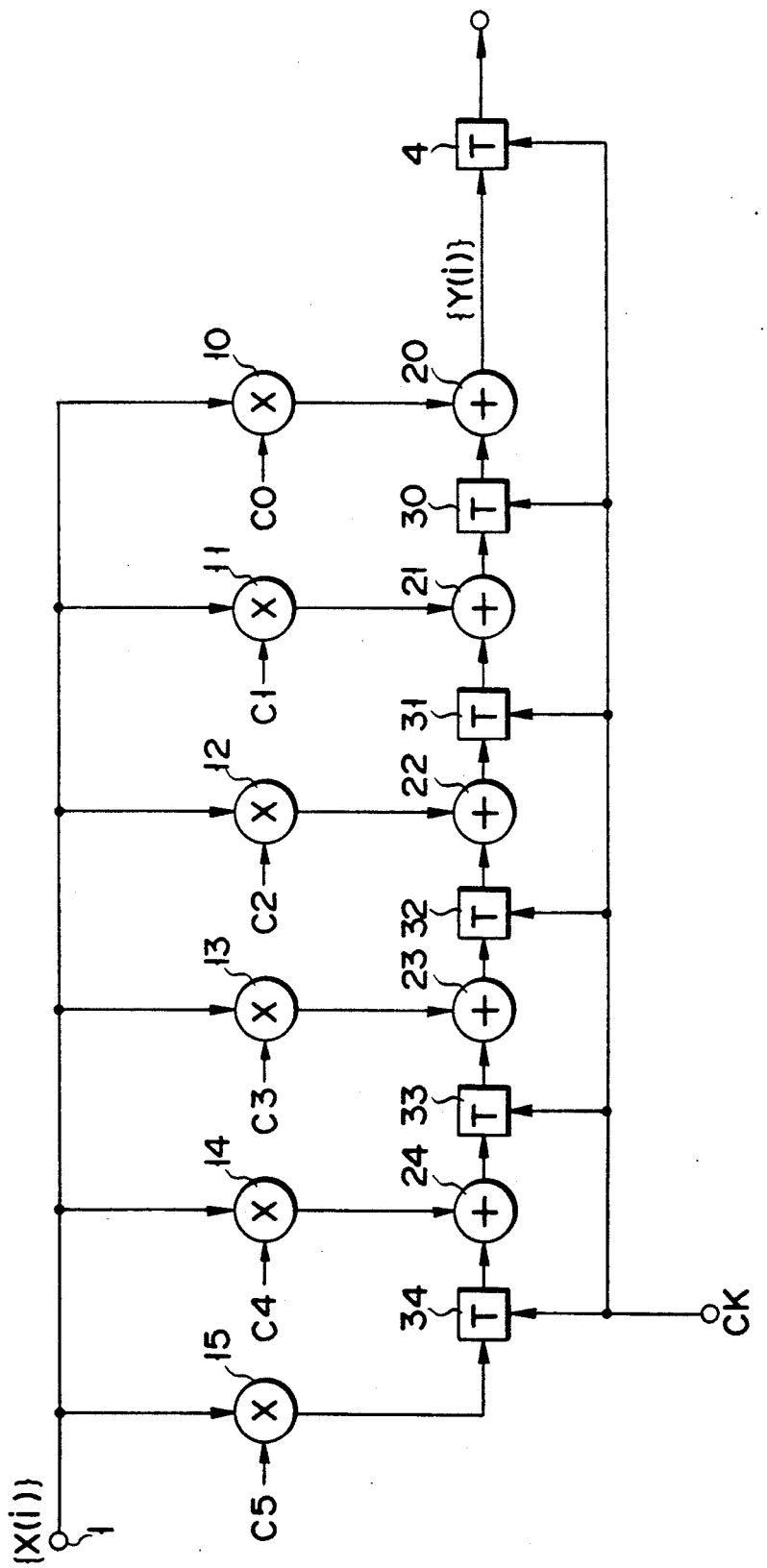
FIG. 6 illustrates a conventional transversal filter.
Figure 7:
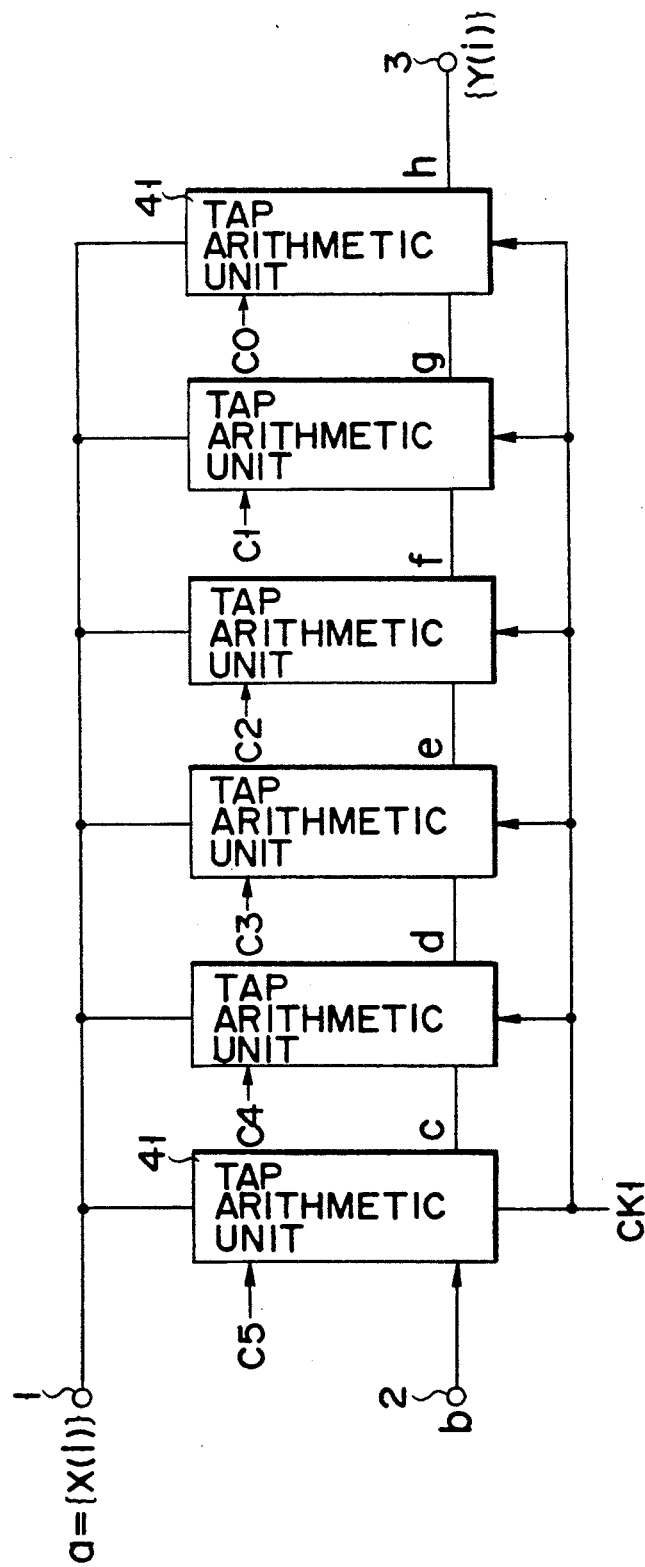
FIG. 7 is a hardware representation of the transversal filter of FIG. 6.
Figure 8:
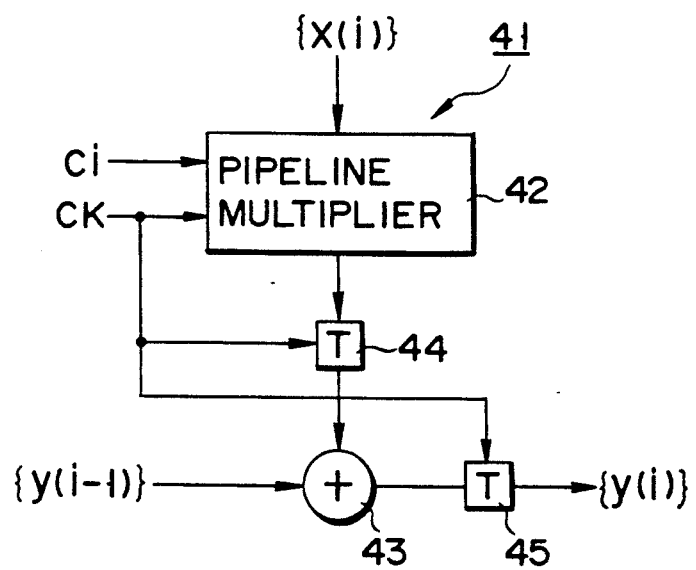
FIG. 8 is a block diagram of the tap arithmetic unit of FIG. 7.
Figure 9A:
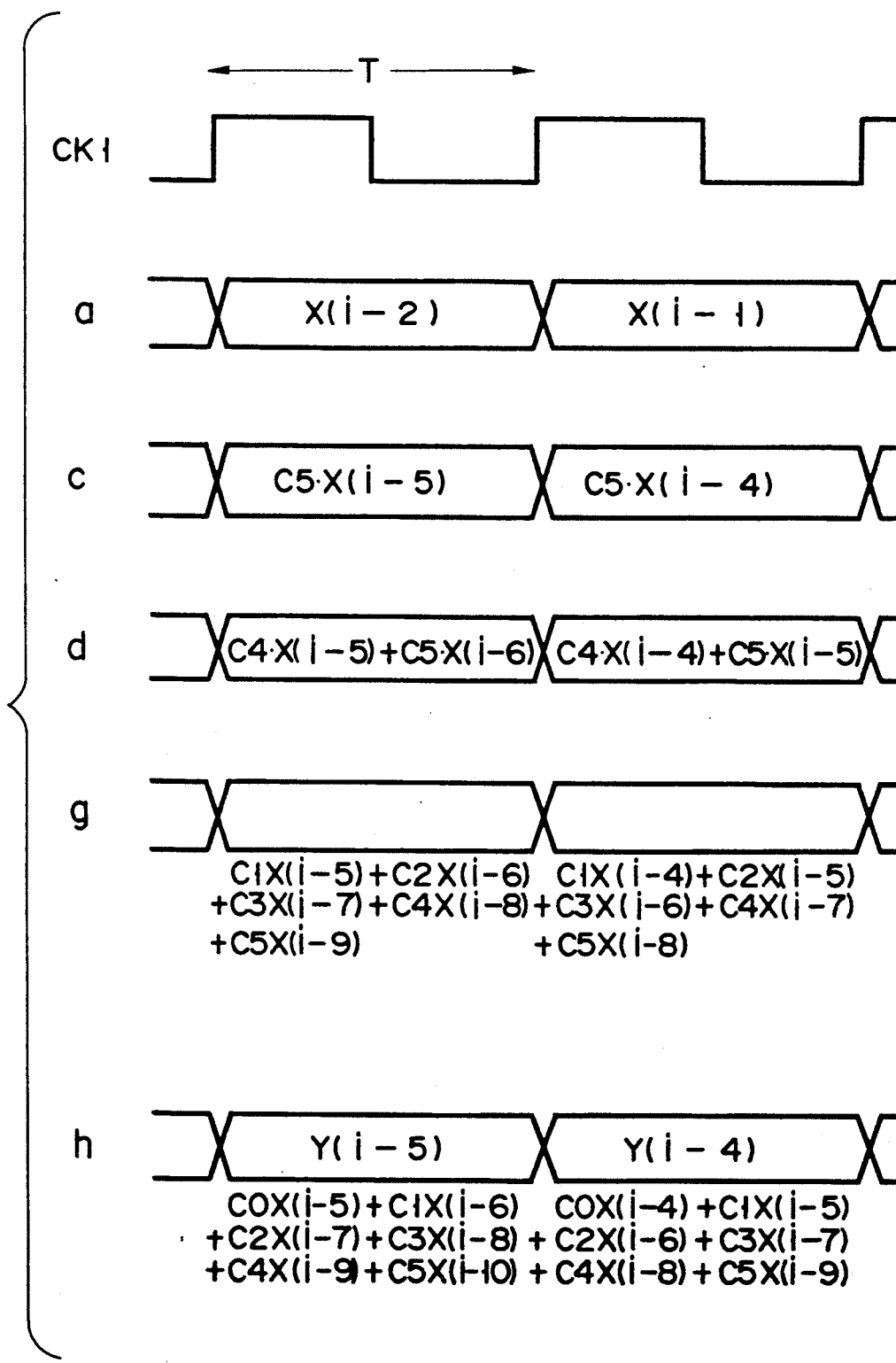
FIGS. 9A, 9B and 9C are a diagram for use in explanation of the operation of the transversal filter of FIG. 8.
Figure 9B:
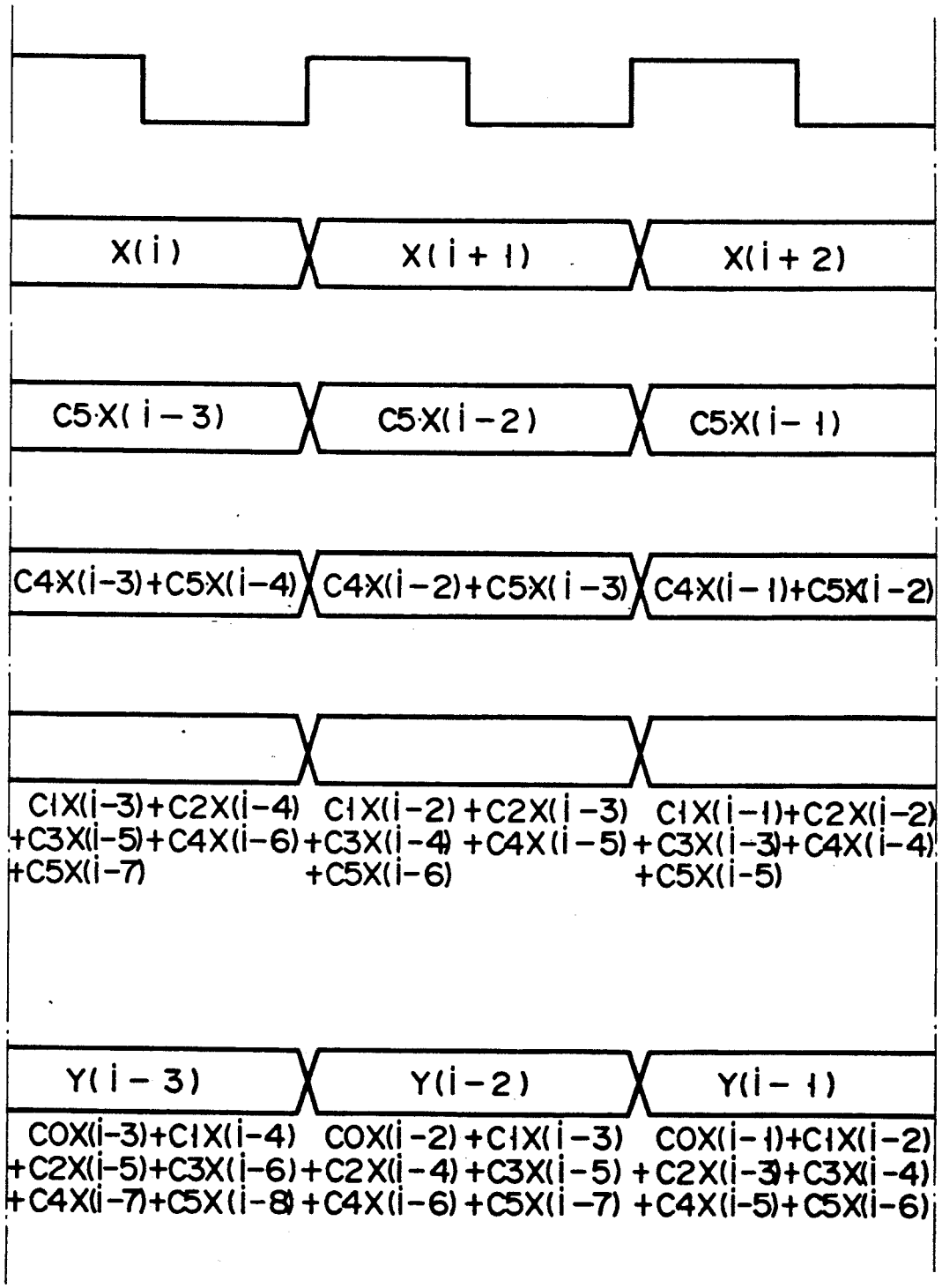
Figure 9C:
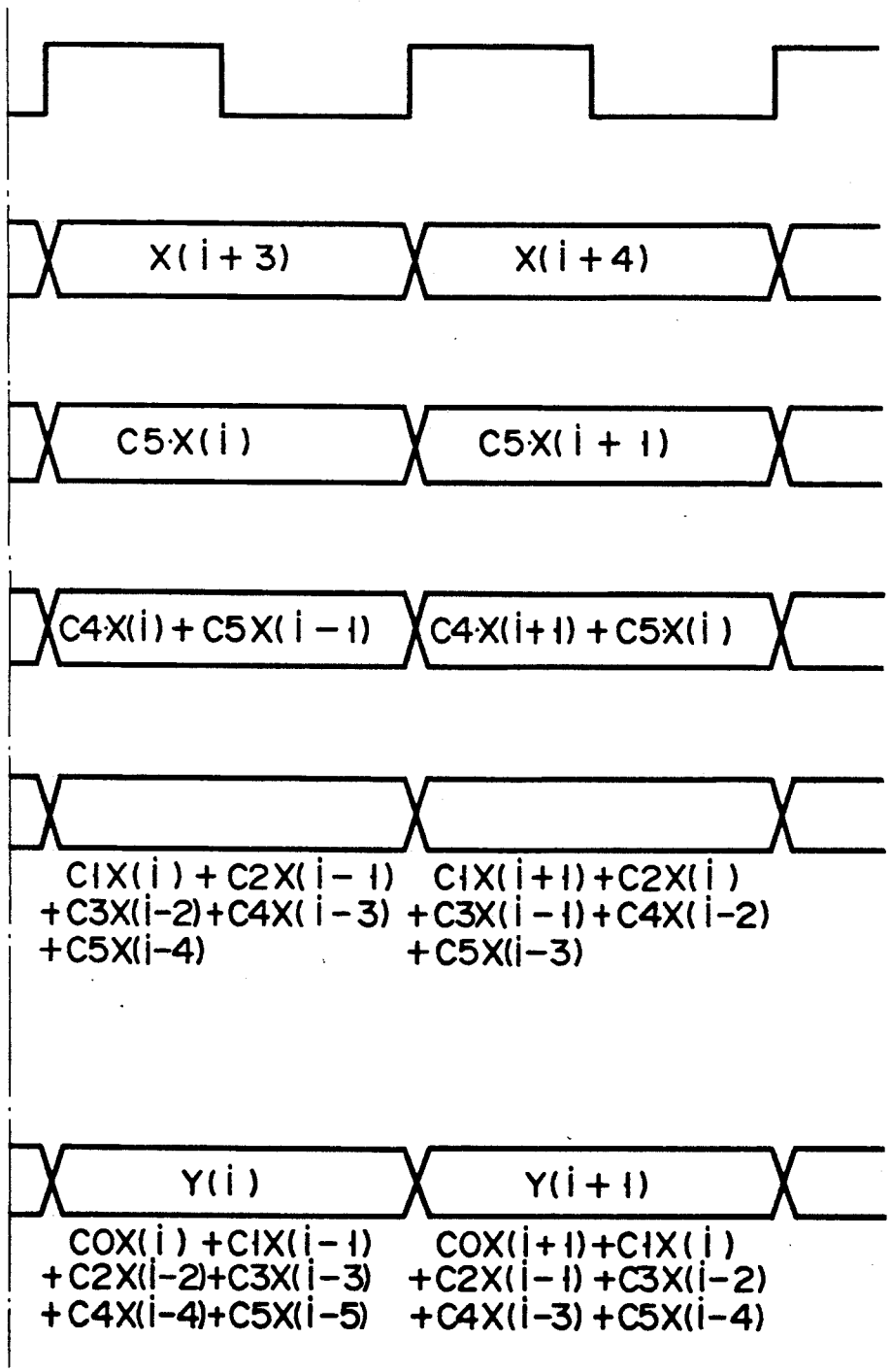
Figure 10:
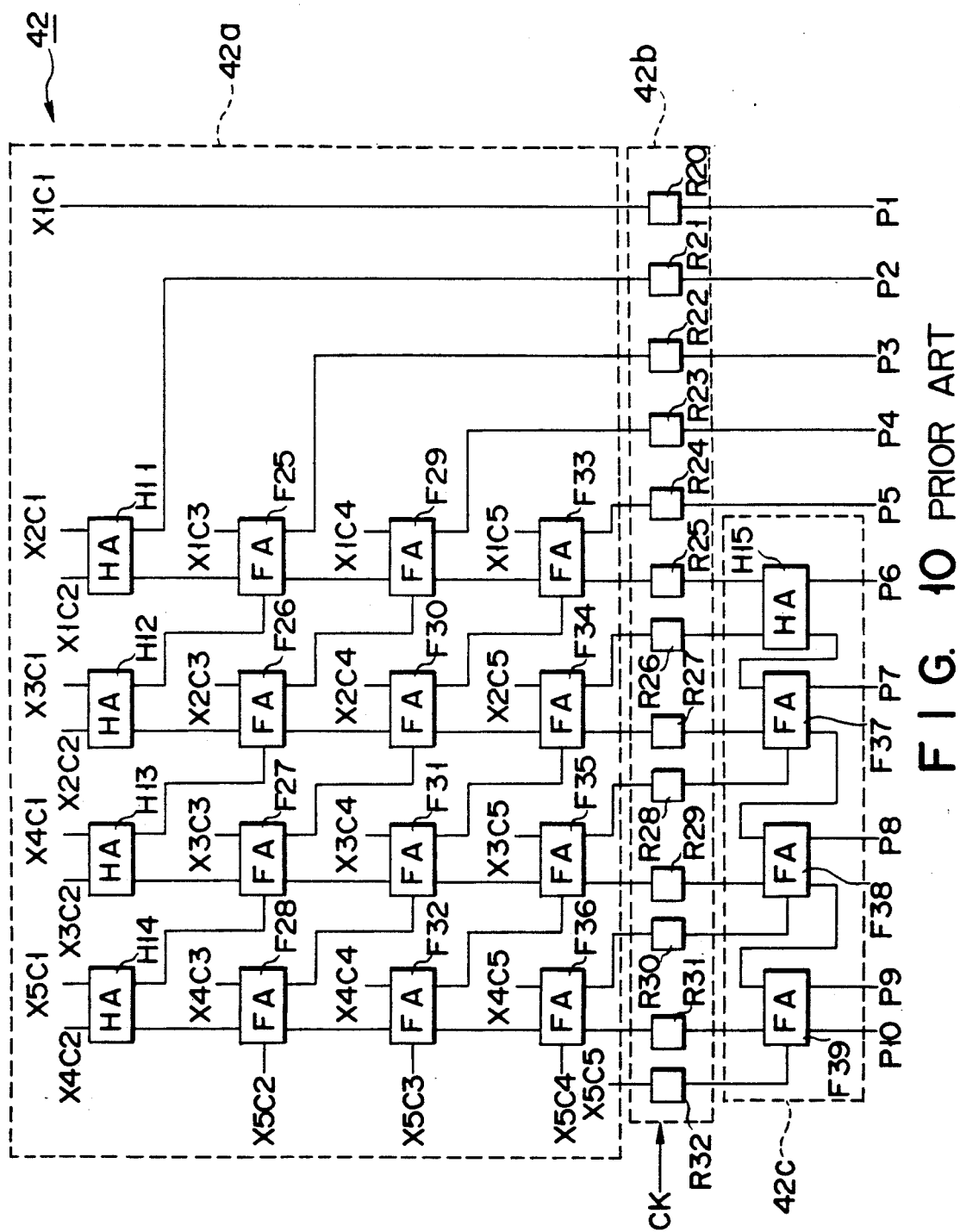
FIG. 10 is a detailed block diagram of the pipeline multiplier of FIG. 8.

FIGS. 5A, 5B and 5C are a diagram for use in explanation of the operation of the transversal filter.

The select signal S for the selectors 53 to 55 and the clock signal CK1 have a period of T, while the clock signal CK2 has a period of T/2. The input signal a has been sampled every T and the data contents vary in synchronism with the clock signal CK1 and the select signal S as follows:

$$X(i-3), X(i-2), X(i-1), X(i), \ldots$$

On the other hand, since each of the tap arithmetic units 50 to 52 includes a pipeline register, their outputs will be represented as follows. The output d of the tap arithmetic unit 52 will vary at intervals T/2 as follows:

$$C4 \cdot X(i-3), C5 \cdot X(i-3), C4 \cdot X(i-2), C5 \cdot X(i-2),$$

$$C4 \cdot (Xi-1), C5 \cdot X(i-1), C4 \cdot X(i), C5 \cdot x(i), \ldots$$

Moreover, the output f of the tap arithmetic unit 51 will be $$C2 \cdot X(i-3) + C4 \cdot X(i-5),$$

$$C3 \cdot X(i-3) + C5 \cdot X(i-5),$$

$$C2 \cdot X(i-2) + C4 \cdot X(i-4),$$

$$C3 \cdot X(i-2) + C5 \cdot X(i-4),$$

$$C2 \cdot X(i-1) + C4 \cdot X(i-3),$$

$$C3 \cdot X(i-1) + C5 \cdot X(i-3),$$

$$C2 \cdot X(i) + C4 \cdot X(i-2),$$

$$C3 \cdot X(i) + C5 \cdot X(i-2), \ldots$$

Furthermore, the output h of the tap arithmetic unit 50 will vary at intervals T as follows:

$$C0 \cdot X(i-3) + C2 \cdot X(i-5) + C4 \cdot X(i-7),$$

$$C1 \cdot X(i-3) + C3 \cdot X(i-5) + C5 \cdot X(i-7),$$

$$C0 \cdot X(i-2) + C2 \cdot X(i-4) + C4 \cdot X(i-6),$$

$$C1 \cdot X(i-2) + C3 \ X(i-4) + C5 \cdot X(i-6),$$

$$C0 \cdot X(i-1) + C2 \ X(i-3) + C4 \cdot X(i-5),$$

$$C1 \cdot X(i-1) + C3 \ X(i-3) + C5 \cdot X(i\ 5),$$

$$C0 \cdot X(i) + C2 \ X(i-2) + C4 \cdot X(i-4),$$

$$C1 \cdot X(i) + C3 \ X(i-2) + C5 \cdot X(i\ 4), \ldots$$

In this way, the sum $\Sigma E$ of the outputs of the even-numbered taps (the coefficients C0, C2, C4) and the sum $\Sigma 0$ of the outputs of the odd-numbered taps (the coefficients Cl, C3, C5) appear alternately. From the output terminal 02 adapted to increase the total number of taps the output h of the tap arithmetic unit 50 is output delayed by the delay element 59a.

The sum $\Sigma E$ of the outputs of the even-numbered taps and the sum $\Sigma 0$ of the outputs of the odd-numbered taps are added in the adder 59b of the cascade data output circuit 59 and the result of the addition is held by the delay element 59a for interval T. Thereby, a desired output signal $\{Y(i)\}$ can be obtained from the output terminal 01 of the last transversal filter stage.

According to the construction described above, in a full-adder array constituting a tap arithmetic unit, an input signal $\{X(i)\}$ and coefficients Ci are multiplied and data input signals $\{y(i-1)\}$ are added. Therefore, the number of shift registers can be reduced in comparison with the prior art and thus, in the integrated-circuit version of the transversal filter, the area of a chip can be decreased and its manufacturing cost can be reduced.

Moreover, since the number of shift registers is small, even in the case where a number of transversal filters are connected in cascade, an increase in the delay amount of the entire system and the addition of full-adders in succeeding transversal filter stages can be avoided.

Although the preferred embodiment of the present invention has been described and disclosed, it is apparent that other embodiments and modifications are possible.

What is claimed is:

1. An input-weighted transversal filter for sequentially weighting an input signal by means of a plurality of tap arithmetic units comprising:

a selector for selecting on coefficient from among a plurality of coefficients;

the plurality of tap arithmetic units for multiplying an input signal which has been sampled at regular intervals and the coefficient selected by the selector, each of said tap arithmetic units adding an output signal of the preceding tap arithmetic unit to the result of the multiplication; and first delay circuits each interposed between adjacent ones of said tap arithmetic units, each of said tap arithmetic units including:

a full-adder array for multiplying said input signal and said coefficients;

a full- and half-adder array for adding the output signal of the preceding tap arithmetic unit to the result of the multiplication performed by the full-adder array;

a second delay circuit for delaying an output signal of said full- and half-adder array by a perdetermined time; and an adder for adding the output signal of the second delay circuit.

2. A filter according to claim 1, in which said full-adder array comprises a carry save adder.

3. A filter according to claim 1, in which each of said first and second delay circuits comprises a shift register.

4. An input-weighted transversal filter for sequentially weighting an input signal by means of a plurality of tap arithmetic units comprising:

the plurality of tap arithmetic units for multiplying an input signal which has been sampled at regular intervals and coefficients, each of said tap arithmetic units adding an output signal of the preceding tap arithmetic unit to the result of the multiplication; and first delay circuits each interposed between adjacent ones of said tap arithmetic units, each of said tap arithmetic units including:

a multiplication circuit for multiplying the input signal and the coefficients;

a plurality of first adder circuits for adding an output signal of the preceding tap arithmetic unit to the results of the multiplication performed by said multiplication circuit;

a second delay circuit for delaying the respective results of the addition by said first adder circuits by a predetermined time; and a second adder for adding output signals of said second delay circuit, said first and second delay circuits being timed to the preceding tap arithmetic unit for arithmetic operations.

5. A filter according to claim 4, in which each of said tap arithmetic units includes a selector for selecting among said coefficients.

6. A filter according to claim 4, in which said full-adder array comprises a carry save adder.

7. A filter according to claim 4, in which each of said first and second delay circuits comprises a shift register.

8. An input-weighted transversal filter for sequentially weighting an input signal by means of a plurality of tap arithmetic units comprising:

the plurality of tap arithmetic units for multiplying an input signal which has been sampled at regular intervals and coefficients, each of said tap arithmetic units adding an output signal of the preceding tap arithmetic unit to the result of the multiplication, each of said tap arithmetic units including:

a full-adder array for multiplying said input signal and said coefficients;

a full- and half-adder array for adding the output signal of the preceding tap arithmetic unit to the result of the multiplication performed by the full-adder array;

a delay circuit for delaying an output signal of said full- and half-adder array by a predetermined time; and an adder for adding the output signal of the delay circuit.

* * * * *